United States Patent
Kyung et al.

(10) Patent No.: US 6,304,500 B1
(45) Date of Patent: Oct. 16, 2001

(54) INTEGRATED CIRCUIT MEMORY DEVICES HAVING DATA INPUT AND OUTPUT LINES EXTENDING IN THE COLUMN DIRECTION, AND CIRCUITS AND METHODS FOR REPAIRING FAULTY CELLS

(75) Inventors: Kye-hyun Kyung; Byung-sik Moon, both of Kyungki-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/713,107

(22) Filed: Nov. 15, 2000

Related U.S. Application Data

(62) Division of application No. 09/203,262, filed on Dec. 1, 1998, now Pat. No. 6,151,263.

(30) Foreign Application Priority Data

Dec. 4, 1997 (KR) .................................................. 97-65906

(51) Int. Cl.[7] .................................................... G11C 7/00
(52) U.S. Cl. ........................ 365/200; 365/63; 365/230.03
(58) Field of Search ........................ 365/63, 200, 230.03, 365/230.01, 51

(56) References Cited

U.S. PATENT DOCUMENTS

| | | | |
|---|---|---|---|
| 4,473,895 | * 9/1984 | Tatematsu | 365/200 |
| 4,866,676 | 9/1989 | Crisp et al. | 365/200 |
| 4,979,145 | 12/1990 | Remington et al. | 364/900 |
| 5,231,604 | 7/1993 | Watanabe | 365/189.05 |
| 5,289,516 | * 2/1994 | Kimura et al. | 377/39 |
| 5,301,153 | 4/1994 | Johnson | 365/200 |
| 5,381,367 | 1/1995 | Kajimoto | 365/189.01 |
| 5,469,401 | 11/1995 | Gillingham | 365/230.06 |
| 5,485,426 | 1/1996 | Lee et al. | 365/203 |
| 5,499,215 | 3/1996 | Hatta | 365/230.03 |
| 5,500,821 | * 3/1996 | Tanaka | 365/200 |
| 5,502,676 | 3/1996 | Peley, III et al. | 365/200 |
| 5,621,691 | * 4/1997 | Park | 365/200 |
| 5,633,826 | 5/1997 | Tsukada | 365/200 |
| 5,754,480 | 5/1998 | Sato | 365/189.05 |
| 6,151,263 | * 11/2000 | Kyung et al. | 365/230.03 |
| 6,178,127 | * 1/2001 | Haraguchi | 365/200 |

FOREIGN PATENT DOCUMENTS

| | | |
|---|---|---|
| 0361404A2 | 4/1990 | (EP) . |
| 0401957 | 12/1990 | (EP) . |
| 0434200A1 | 6/1991 | (EP) . |
| 0477809A2 | 4/1992 | (EP) . |
| 0795825 | 9/1997 | (EP) . |
| 2 300 737A | 11/1996 | (GB) . |

OTHER PUBLICATIONS

Search Report, French Patent Application 9815298, Jul. 2, 1999.
Search Report, GB 9811155.2, Mar. 18, 1999.

* cited by examiner

*Primary Examiner*—David Nelms
*Assistant Examiner*—Gene N. Auduong
(74) *Attorney, Agent, or Firm*—Myers Bigel Sibley & Sajovec

(57) ABSTRACT

Integrated circuit memory devices having data input and output lines in a column direction and circuits and methods for repairing faulty cells are provided. A column select line according to the present invention extends along a row direction. Data input and output lines extend along a column direction. In repairing faulty cells, the column having the faulty cells is not directly replaced by a redundancy column but rather is replaced by an adjacent column. Thus, an increase of layout area upon increase of the input and output lines can be reduced. The operational current also may be reduced. Differences in parasitic capacitance from the respective columns to global input and output lines also may be reduced. Also, the faulty cells may be repaired without lowering the speed at which data is input and output during the redundancy operation.

10 Claims, 11 Drawing Sheets

US 6,304,500 B1

INTEGRATED CIRCUIT MEMORY DEVICES HAVING DATA INPUT AND OUTPUT LINES EXTENDING IN THE COLUMN DIRECTION, AND CIRCUITS AND METHODS FOR REPAIRING FAULTY CELLS

This application is a divisional of Ser. No. 09/203,262 filed Dec. 1, 1998 U.S. Pat. No. 6,151,263.

FIELD OF THE INVENTION

The present invention relates to integrated circuit memory devices, and more particularly, to repairing faulty cells in memory devices.

BACKGROUND OF THE INVENTION

In general, integrated circuit memory devices include a plurality of memory cells arranged in rows and columns that extend along a respective row direction and column direction. A specific memory cell is selected by a row address and a column address. The data of the selected memory cell moves to local input and output lines through a pair of bit lines.

When memory cells are connected to a pair of bit lines, the parasitic capacitance may increase. Accordingly, the memory may operate more slowly, due to the large parasitic capacitance, as the number of memory cells connected to a pair of bit lines increases. Also, when all the cells of a memory device are in one block, multi-bit input and output may be difficult to perform. Therefore, the memory device may be divided into multiple banks. Each bank can independently input and output data. Such a structure is called a "stack bank" architecture.

FIG. 1 is a block diagram showing the input and output lines of a memory device having a conventional stack bank structure. Referring to FIG. 1, in the memory device having the stack bank structure, a bank has a structure like that of stacked bricks. Each bank has a row decoder, a sense amplifier, and a local column decoder. Global input and output lines GIO use a common data bus. The row decoder is selected by a row bank address and is activated by selecting the word line of the memory cell. The word line of the memory cell is arranged in the row direction. The local column decoder is operated by the output signals of a column bank address and a global column decoder. There is one local column decoder in every bank. The output signal lines of the global column decoder GCSL and the output signal of the local column decoder LCSLi are all arranged in the column direction. When the word line is selected by the row bank address and the row address, all the sense amplifiers of the selected banks operate. The data of the selected bank is amplified by the sense amplifier and moves to the local input and output lines in the row direction. The data moved to the LIO again moves to the global input and output lines GIO. The global input and output lines GIO are commonly connected to the memory banks and are arranged in the column direction.

FIG. 2 is a block diagram showing a faulty cell repairing circuit for the memory device of FIG. 1. In the faulty cell repairing circuit of FIG. 2, a normal switch is arranged between the data line DIOi of the memory cell and a local input and output line LIOi. A redundancy switch is arranged between a redundancy input and output line RIO and the local input and output line LIOi. All the normal switches are turned on in a normal operating mode. At this time, the redundancy switches are all turned off. Therefore, the data lines DIOi are respectively connected to the local input and output lines LIOi. For example, data can be input and output since DIO0 is connected to LIO0, DIO1 to LIO1, and DIOn-1 to LIOn-1.

However, when a cell is faulty, the normal switch of the related column is turned off and the redundancy switch is turned on. For example, when a faulty cell is generated in the column corresponding to the data line DIO1, a normal switch 205 connected to the data line DIO1 is turned off and a redundancy switch 207 is turned on. Therefore, the local input and output line LIO1 is disconnected from the data line DIO1 and connected to the redundancy input and output line RIO. The remaining data lines are connected to the respective local input and output lines and operate as in the normal operating mode.

Memory devices and faulty cell repairing circuits having the stack bank structure according to conventional technology may have problems. First, in a memory device having the conventional stack bank structure, the layout area may increase when the input and output lines increase. In particular, the local input and output lines LIO are assigned to each bank. A local column decoder exists in each bank. When increasing the input and output lines, the memory cell banks may be divided more or the number of local input and output lines output through the sense amplifier may increase. Also, the number of global input and output lines to which the respective local input and output lines are connected may increase. Therefore, the input and output lines may increase in the row and column directions of a memory chip.

Second, memory devices having the conventional stack bank structure may draw a large current. Since the local column decoder of each bank generally operates in a reading or writing mode, the current increases. Third, a load difference is generated based upon the different distances between the global input and output lines and the respective points of the local input and output lines. Accordingly, a time difference in outputting data from the respective columns to the global input and output lines may be generated, thus deteriorating the performance of the memory. Finally, in the faulty cell repairing circuit of FIG. 2, a plurality of redundancy switches are connected to the redundancy input and output line RIO. Therefore, the data may be input and output more slowly during the redundancy operation.

SUMMARY OF THE INVENTION

Integrated circuit memory devices according to the present invention comprise a memory block including a plurality of memory cells arranged in rows and columns that extend along a respective row direction and column direction. A row decoder selects a row in the memory block in response to a row address signal group. A column select line selects a column in the memory block. A column decoder activates the column select line in response to a column address signal group. Data input and output lines input data to and output data from the memory cell selected by the row decoder and the column decoder. The column select line extends along the row direction and the data input and output lines extend along the column direction. The data input and output lines extend above the memory block area. Accordingly, the size and/or current consumption of the memory device may be reduced. Loading differences may also be reduced.

In another aspect of the present invention, integrated circuit memory devices comprise a normal memory cell block including first and second normal columns and a redundancy memory cell block having a redundancy column. First and second normal data input and output lines input data to and output data from the first and second normal columns, respectively. Redundancy data input and output lines input data to and output data from the redundancy column. First and second data transfer lines input data to or output data from an external circuit. A first switch connects the first data transfer line to the first normal data input and output line during a normal operation. The first switch connects the first data transfer line to the redundancy data input and output lines during a redundancy operation. A second switch connects the second data transfer line to the second normal data input and output line during a normal operation. The second switch connects the second data transfer line to the first normal data input and output line during a redundancy operation. Therefore, the difference in lengths of the data paths of the respective columns during the redundancy operation may be reduced.

In still another aspect of the present invention, integrated circuit memory devices comprise a normal memory cell block including first, second, and third normal columns and a redundancy cell block including first and second redundancy columns. First, second, and third normal data input and output lines input data to and output data from the first, second, and third normal columns, respectively. First and second redundancy data input and output lines input data to and output data from the first and second redundancy columns, respectively. First, second, and third data transfer lines input data to and output data from an external circuit. First, second, and third switches connect the first, second, and third data transfer lines to the first, second, and third normal data input and output lines during a normal operation. The first switch connects the first data transfer line to the first redundancy data input and output line during a one column moving redundancy operation. The first switch connects the first data transfer line to the second redundancy data input and output line during a two column moving redundancy operation. The second switch connects the second data transfer line to the first normal data input and output line during the one column moving redundancy operation. The second switch connects the second data transfer line to the first redundancy data input and output line during the two column moving redundancy operation. The third switch connects the third data transfer line to the second normal data input and output line during a one column moving redundancy operation. The third switch connects the third data transfer line to the first normal data input and output line during the two column moving redundancy operation. Therefore, the difference in lengths of the data paths of the respective columns during the redundancy operation may be reduced.

In still another aspect of the present invention, faulty cell repairing methods and systems for integrated circuit memory devices having a plurality of normal columns and at least one redundancy column are provided. The number i of a column having faulty cells is detected, by counting columns with reference to the redundancy column. The number k of a column which will perform the operation of reading or writing of data is detected, by counting columns with reference to the redundancy column. A data transfer line is connected to a normal data input and output line when k is larger than i. The data transferring line is connected to the data input and output line of the preceding column when k is not larger than i.

BRIEF DESCRIPTION OF THE DRAWINGS

The above objects and advantages of the present invention will become more apparent by describing in detail a preferred embodiment thereof with reference to the attached drawings in which.

DETAILED DESCRIPTION OF PREFERRED EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Figure 1:
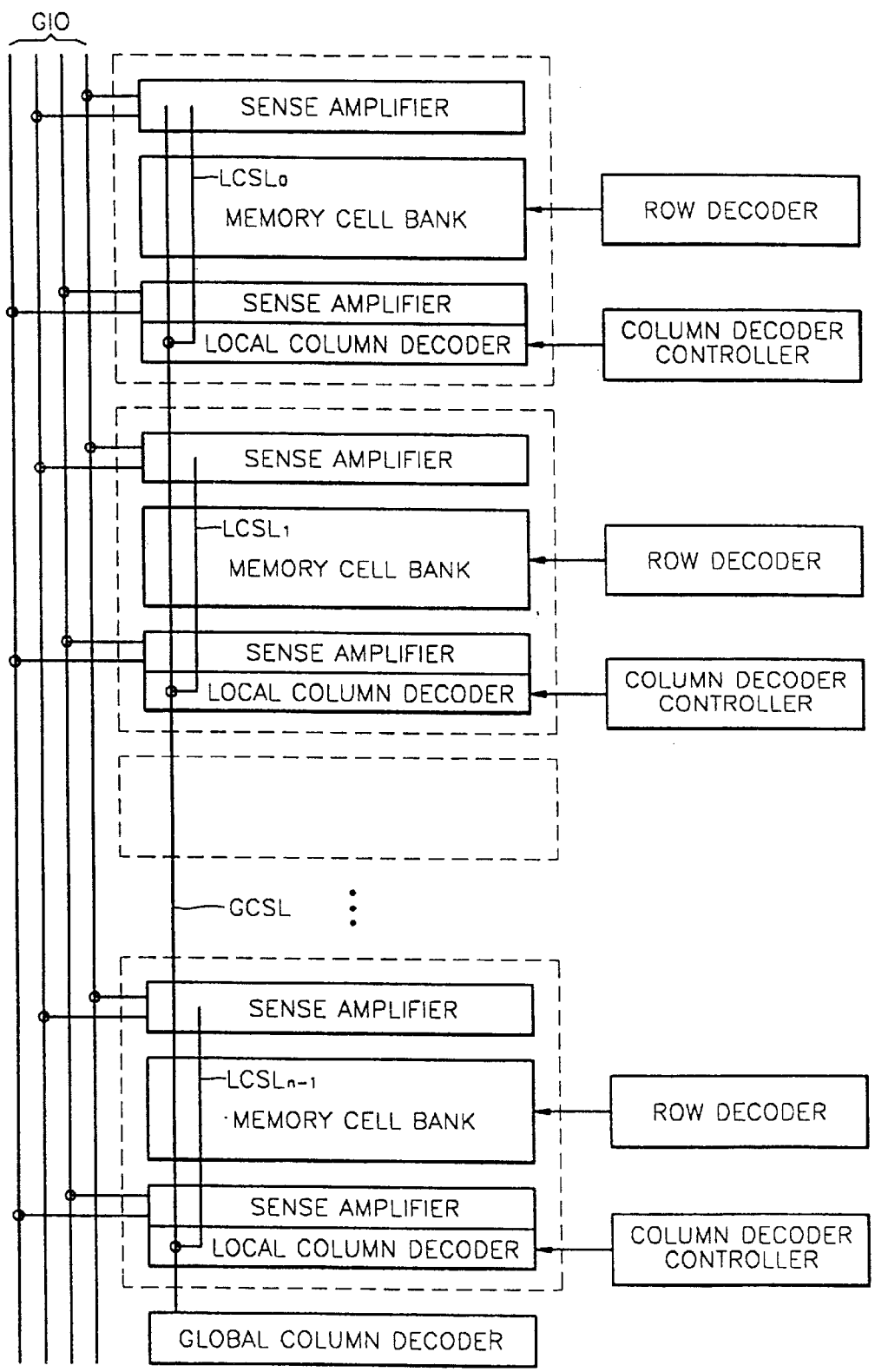
FIG. 1 is a block diagram showing input and output lines of a conventional memory device having a stack bank structure.
Figure 2:
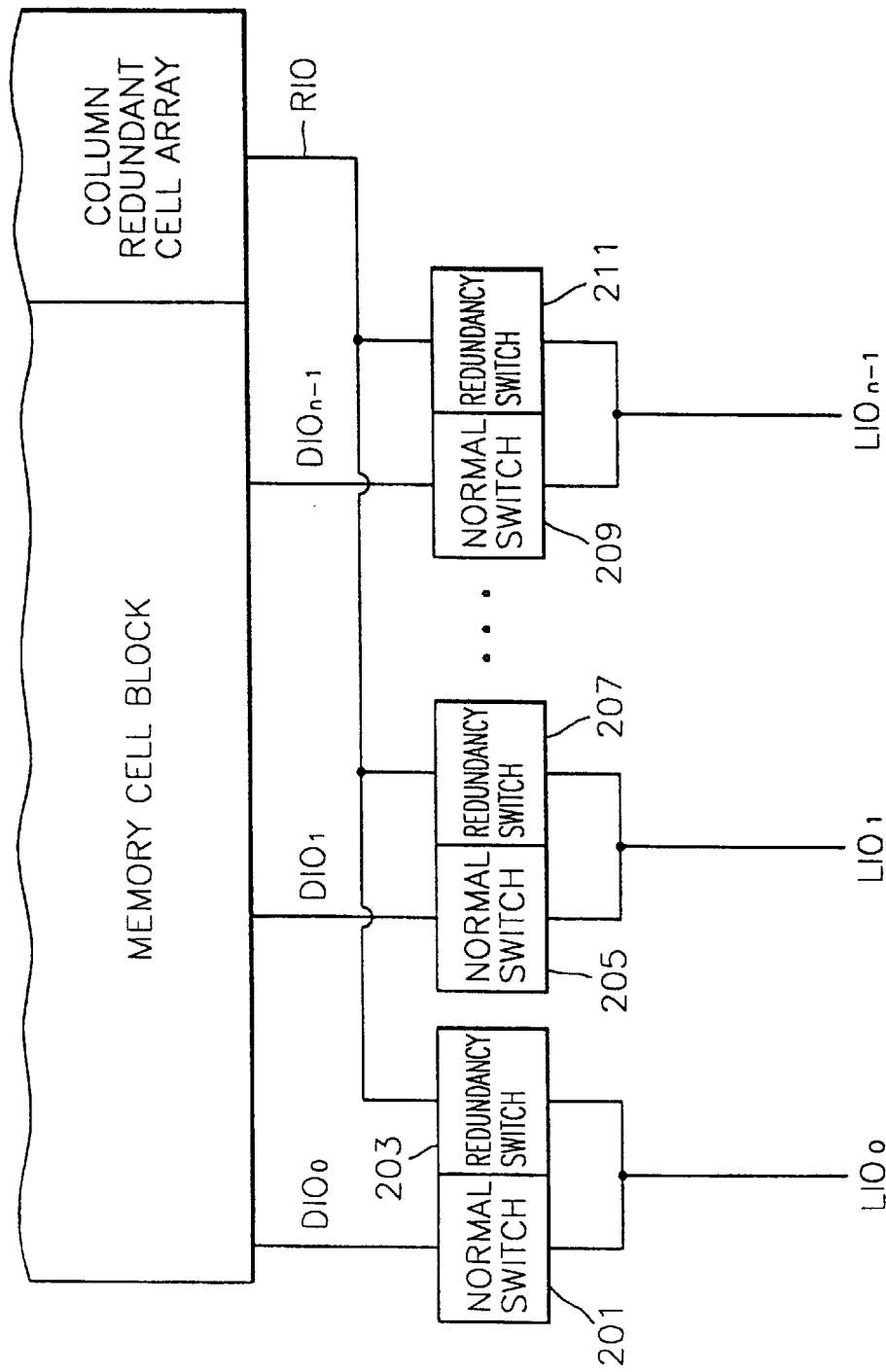
FIG. 2 is a block diagram showing a faulty cell repairing circuit applied to the memory device shown in FIG. 1.
Figure 3:
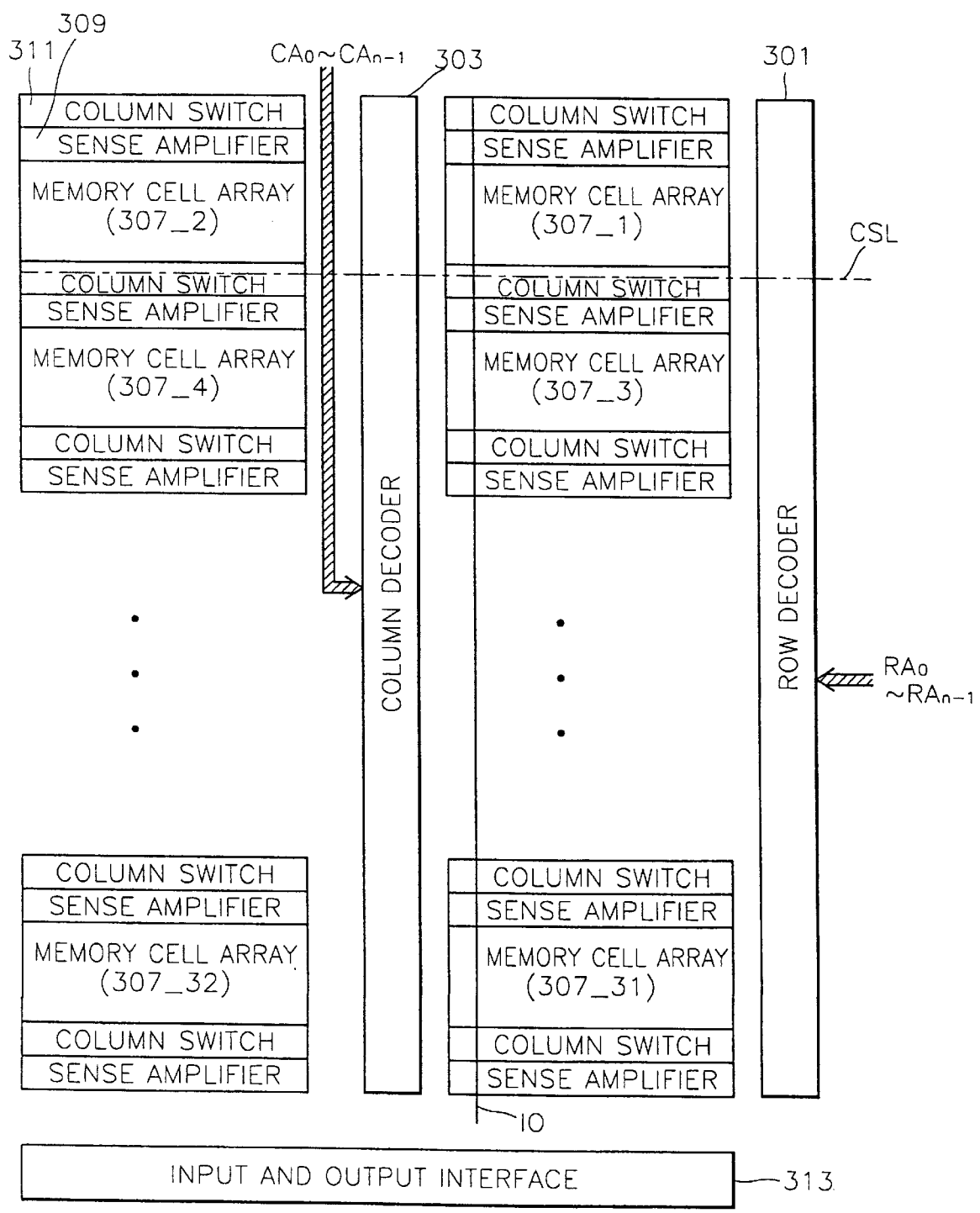
FIG. 3 is a block diagram showing an embodiment of memory devices including data input and output lines in a column direction according to the present invention.

FIG. 3 is a block diagram showing an integrated circuit memory device having data input and output lines in a column direction according to the present invention. Referring to FIG. 3, the present invention relates to a memory device having a memory block including a plurality of memory cells arranged in rows and columns that extend along a respective row direction (horizontal in FIG. 3) and column direction (vertical in FIG. 3). The memory device in the present embodiment includes a row decoder 301, a column decoder 303, and data input and output lines IO.

The memory bank includes many memory cell blocks. Each memory cell bank can independently perform READ and WRITE operations. The row decoder 301 selects a memory cell bank in response to a row address signal group RA0, RA1, . . . , RAn−1, selects the row and activates a word line. The column decoder 303 activates a column select line CSL in response to a column address signal group CA0, CA1, . . . , CAn−1. The column select line CSL selects a column of the memory block. The column select line CSL extends along the row direction. The column decoder 303 according to the present embodiment is arranged on one side of the memory block, in the stacking direction of the stacked bank. The data input and output lines IO input data to and output data from the memory cell selected by the column decoder 303. The data input and output lines IO extend along the column direction. The data input and output lines IO extend above the memory block area.

Referring to FIG. 3, the structure and reading operation of the present embodiment will be described in detail. The present embodiment may include 16 memory cell banks. The size of the entire memory may be 32 Mb and there may be 64 input and output lines. A memory cell bank may include two memory cell arrays. For example, the uppermost memory cell bank includes two memory cell arrays 307_1 and 307_2. The lowermost memory cell bank includes two memory cell arrays 307_31 and 307_32. Each memory cell array may have a memory size of 1 Mb, and one memory cell bank may have a memory size of 2 Mb.

Each memory cell array includes a sense amplifier 309 and a column switch 311. Therefore, the memory cell bank and the memory cell are selected by the address signal group RA), RA1, . . . , and RAn−1, thus activating the related word line. The data of the memory cell connected to the activated word line is transmitted to the sense amplifier over the bit line. The word lines are arranged in the row direction. The bit lines are arranged in the column direction. The data of the memory cell transmitted to the sense amplifier is amplified. The column switch 311 is turned on by the activated column select line CSL. The turned on column switch connects the bit line to the data input and output lines IO. Therefore, the data of the amplified memory cell moves to the data input and output lines IO through the turned on column switch and is transferred to an external pad through an input and output interface 313. The data can be input and output when two columns are selected in one memory cell bank. Therefore, in the above example, 64 units of data can be input and output from the memory chip.

Figure 4:
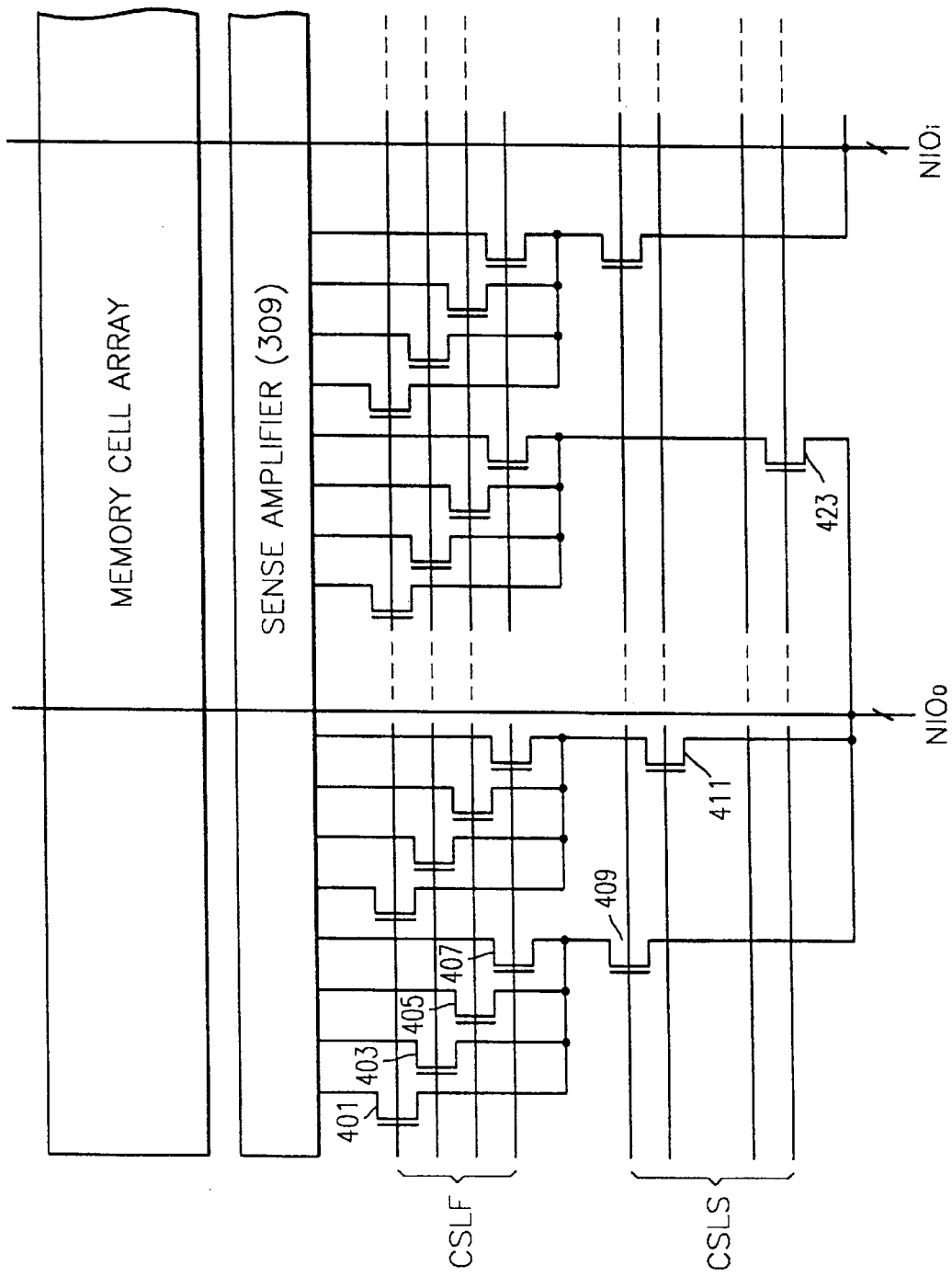
FIG. 4 shows an embodiment of a column switch 311 of FIG. 3 having data input and output lines corresponding to a normal memory cell array.

FIG. 4 shows an embodiment of the column switch 311 of FIG. 3 having data input and output lines corresponding to a normal memory cell array. A first switch group includes four transistors arranged in four columns, in each column of the memory cell array. Namely, the first switch group is repeated on the basis of four transistors 401, 403, 405, and 407 arranged in four columns. In the first switch group, one of the four transistors 401, 403, 405, and 407 is turned on in response to a first output signal CSLF of the column decoder 303. The first output signal CSLF of the column decoder 303 is decoded and activated by lower column addresses. A second switch is turned on in response to a second output signal CSLS of the column decoder 303. The signal CSLS is decoded and activated by upper column addresses. Therefore, in order to connect the bit line of the selected memory cell to the data input and output lines, the first and second switches are turned on. Therefore, the bit line of the memory cell, i.e., the selection of the column, is determined by the combination of the CSLF and the CSLS, and is connected to the normal data input and output lines NIOi.

Figure 5:
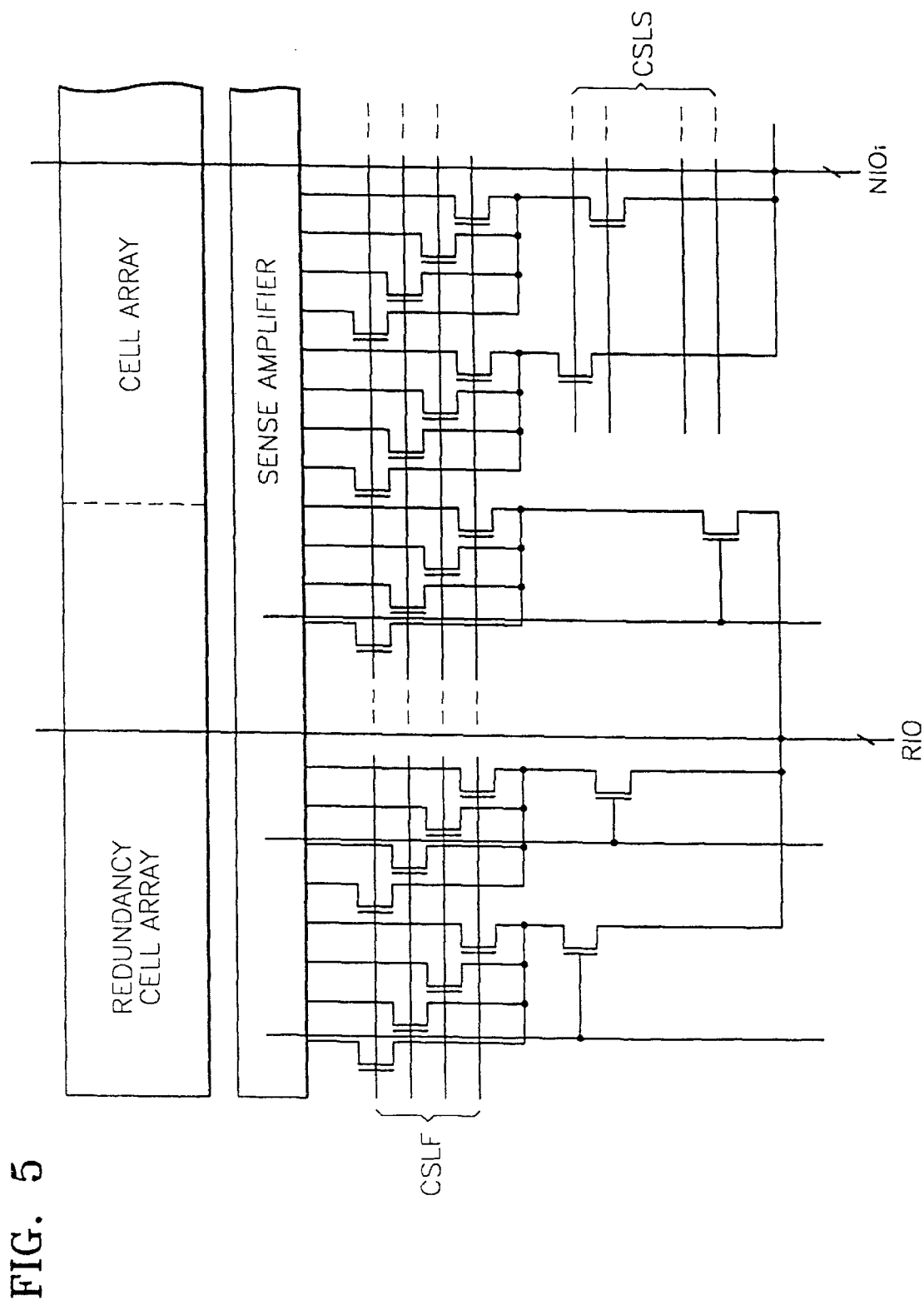
FIG. 5 shows an embodiment of a column switch 311 of FIG. 3 having data input and output lines corresponding to a normal memory cell array and a redundancy memory cell array.

FIG. 5 shows an embodiment of the column switch 311 of FIG. 3 having data input and output lines corresponding to the normal memory cell array and the redundancy memory cell array. Referring to FIG. 5, the data input and output lines in the normal memory cell array are shown in FIG. 4. However, the column switch corresponding to the redundancy memory cell array is different from that corresponding to the normal memory cell array. The first switch group is arranged in the same way as the first switch group corresponding to the normal memory cell array. The signal group CSLF, for controlling the first switch group, is arranged in the row direction. However, while the signal group CSLS for controlling the second switch group of the normal memory cell array is arranged in the row direction, the signal group CSLS for controlling the second switch group of the redundancy memory cell array is arranged in a column direction. As described above, the layout area and the operation current can be reduced when increasing the data input and output lines, by arranging the data input and output lines and data transfer lines in a column direction. Also, there can be less loading difference from the respective input and output lines to the output pad.

Figure 6:
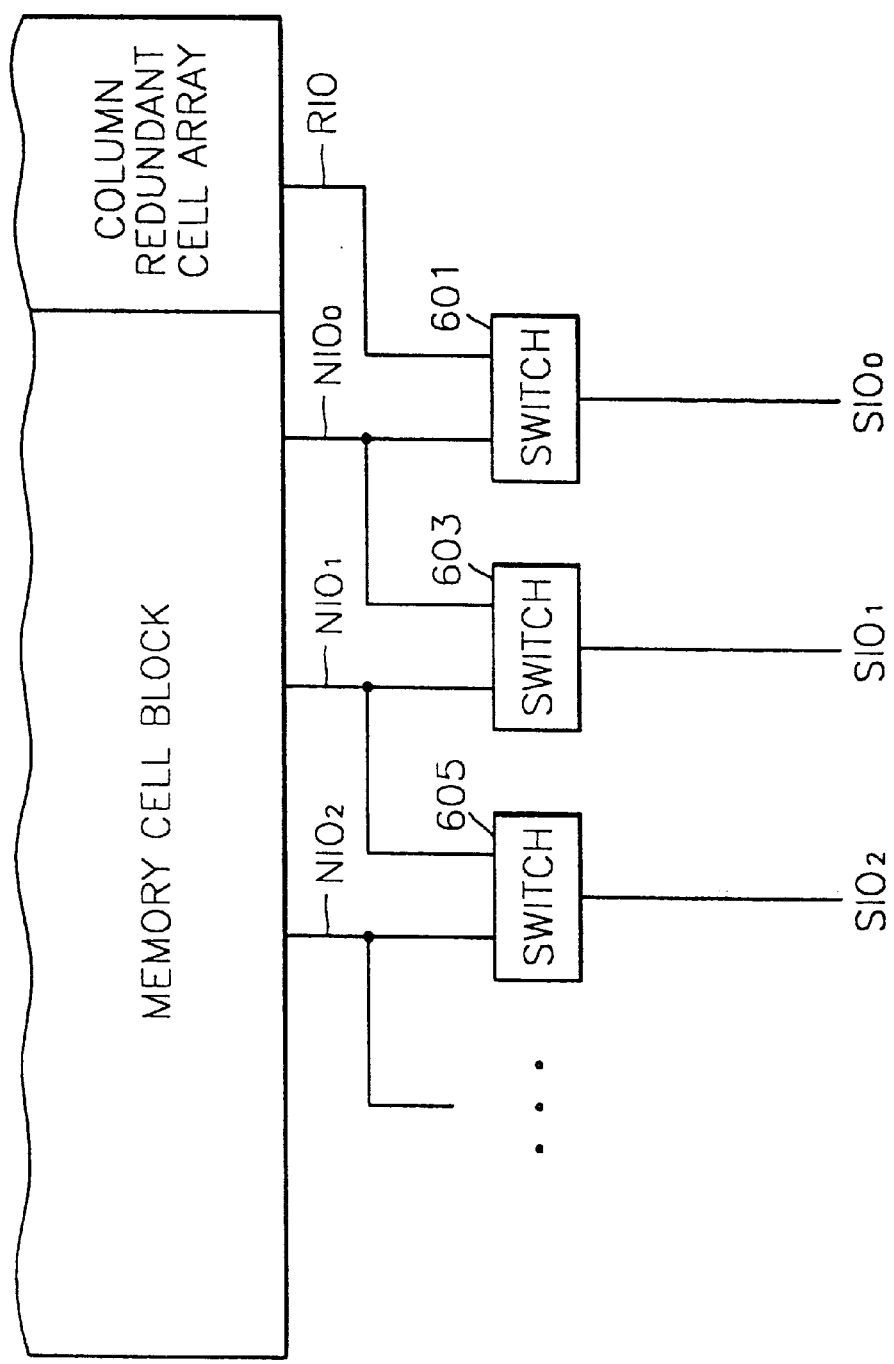
FIG. 6 is a block diagram showing a first embodiment of a faulty cell repairing circuit applied to a memory device of FIG. 3.

FIG. 6 is a block diagram showing a first embodiment of a faulty cell repairing circuit applied to a memory device of FIG. 3. Referring to FIG. 6, the present invention relates to faulty cell repairing circuits for memory devices having at least two normal columns and at least one redundancy column. A memory device according to the present invention includes first and second normal data input and output lines NIO0 and NIO1, a redundancy data input and output line RIO, first and second data transfer lines SIO0 and SIO1, and first and second switches 601 and 603.

The first and second normal data input and output lines NIO0 and NIO1 input and output data, corresponding to the first and second normal columns. The redundancy data input and output line RIO inputs the data to the redundancy column or outputs data from the redundancy column. The first and second data transfer lines SIO0 and SIO1 input the data to an external circuit or output the data from the external circuit.

The first switch 601 connects the first normal data input and output line NIO0 to the first data transfer line 100 when there are no faulty cells in the column connected to the first normal data input and output line NIO0, namely, during the normal operation. However, when there are faulty cells in the column connected to the first normal data input and output line NIO0, namely, during a redundancy operation, the first switch 601 connects the redundancy data input and output line RIO0 to the first data transfer line SIO0. When there are no faulty cells in the column connected to the second normal data input and output line NIO1, namely, during a normal operation, the second switch 603 connects the second normal data input and output line NIO1 to the second data transfer line SIO1. When there are faulty cells in the column connected to the second normal data input and output line NIO0, namely, during the redundancy operation, the second switch 603 connects the first normal data input and output line NIO0 to the second data transfer lines IO1.

It will be understood that reference was made with respect to the two normal columns. However, such a structure can also be applied to a memory device having more than two columns. When there are no faulty cells in the memory cell block, the data transfer lines are connected to the originally assigned normal data input and output lines. However, when there are the faulty cells in the memory cell block, the data transfer lines are connected to adjacent normal data input and output lines. For example, when there are faulty cells in the fifth column from the right side of FIG. 6, i.e., the column corresponding to N104 on the basis of the column redundant cell array, SIO0 and RIO are connected. SIO1, SIO2, SIO3 (not shown), and SIO4 (not shown) are respectively connected to NIO0, NIO1, NIO2, and NIO3 (not shown). The sixth and subsequent data transfer lines, i.e., SIO5 (not shown) are connected to the originally corresponding normal data input and output lines.

Figure 7:
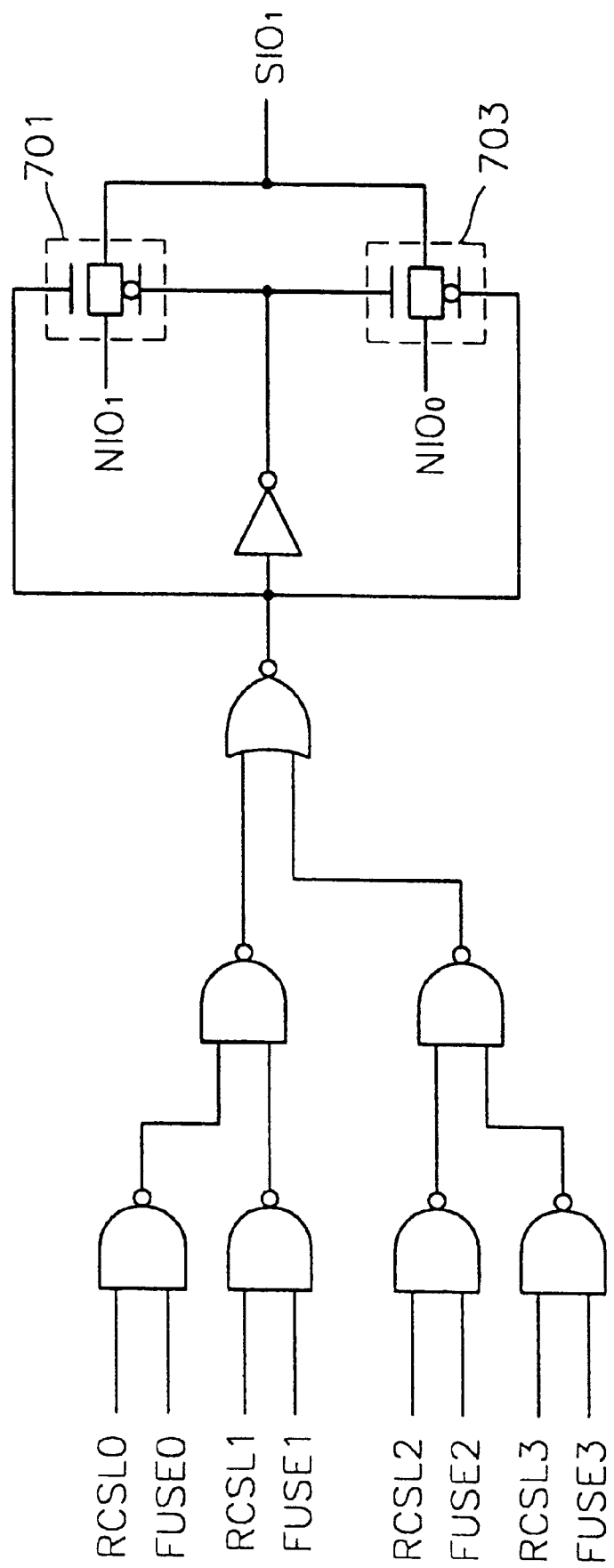
FIG. 7 shows an embodiment of a switch 603 of the faulty cell repairing circuit of FIG. 6.

FIG. 7 shows an embodiment of a switch 603 of the faulty cell repairing circuit of FIG. 6. Referring to FIG. 7, a switch of the present embodiment includes a first transfer gate 701 and a second transfer gate 703. The first transfer gate 701 is turned on in a normal operation state for connecting the normal data input and output line NIO1 to the data transfer line SIO1. The second transfer gate 703 connects the normal data input and output line NIO0 to the data transfer line SIO1 when there are faulty cells in NIO1 or the successive columns, i.e., during the redundancy operation.

In the present embodiment, whether the redundancy operation is to be performed is determined by a redundancy control signal RCSLi and FUSEi generated by a fuse. Namely, when RCSLi and FUSEI simultaneously become "high", the second transfer gate 703 is turned on for connecting the normal data input and output line NIO0 and the data transferring line SIO1. In the present embodiment, reference was made with respect to the switch 603 corresponding to the data transfer line SIO1, but the above also applies to the switches 601 and 605. However, in the switch 601, SIO0 is connected to the redundancy data input and output line RIO during the redundancy operation.

Figure 8:
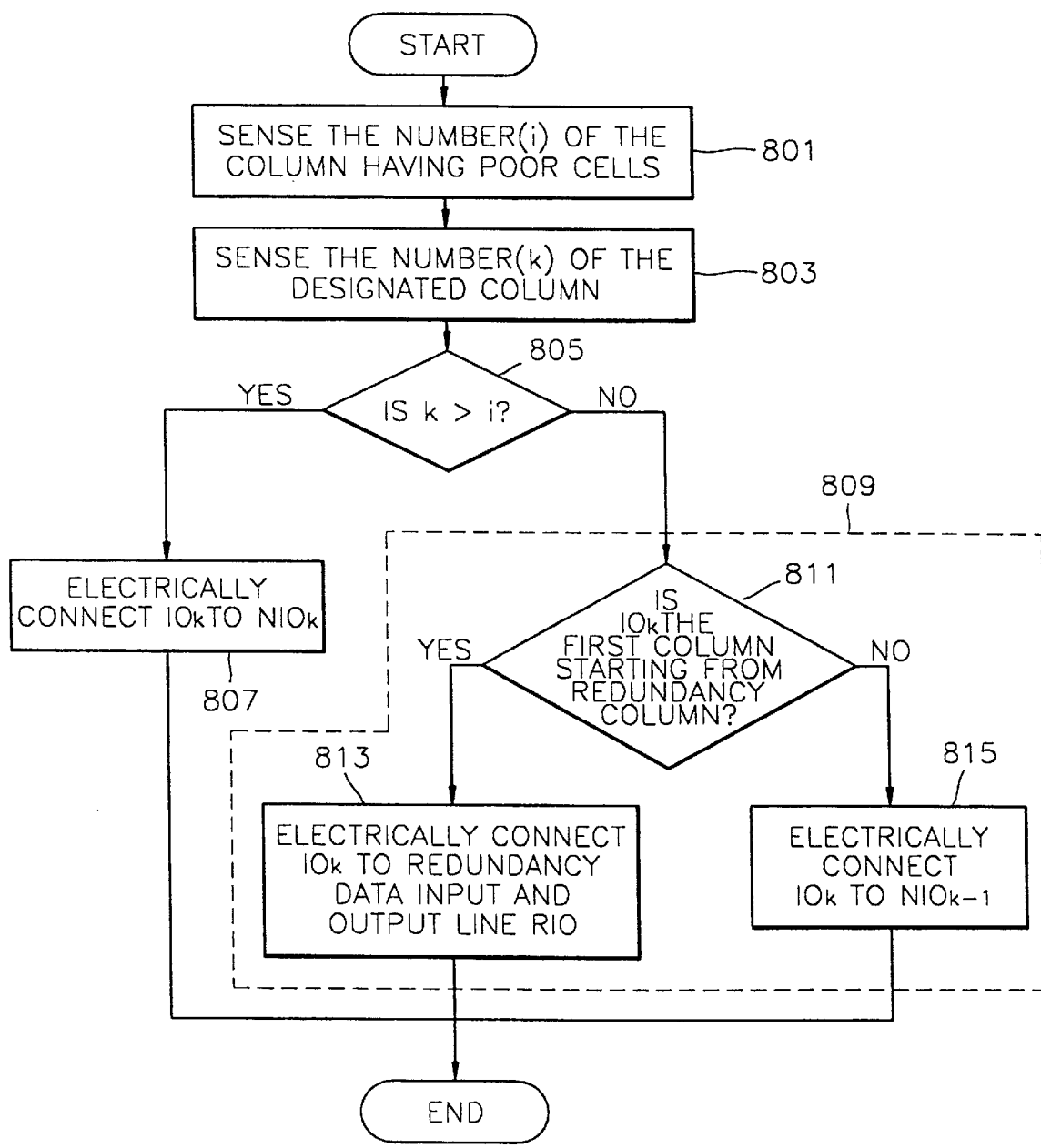
FIG. 8 is a flowchart showing methods and systems for repairing faulty cells that can use the faulty cell repairing circuit of FIG. 6.

FIG. 8 is a flowchart showing methods and systems including respective steps and means for repairing a faulty cell that can use a faulty cell repairing circuit of FIG. 6. Referring to FIG. 8, the present invention relates to repairing a faulty cell of a device having a plurality of normal columns and at least one redundancy column when there are faulty cells in a column. The invention may include a faulty column detecting block 801, a designated column detecting block 803, a determining block 805, a normal connecting block 807, and a repairing block 809.

In the faulty column detecting block 801, the number i of the column to which the faulty cells belong is detected by counting the columns by position with reference to the redundancy column. In the designated column detecting block 803, the number k of a column for performing a reading or writing operation is detected by counting the columns by position with reference to the redundancy column. In the determining block 805, it is determined whether k is larger than i by comparing i and k. In the normal connecting block 807, the data transfer line IOk is connected to the normal data input and output line NIOk when the result of the determining block 805 is "yes". In the repairing block 809, the data transfer line IOk is connected to the data input and output line of the previous column when the result of the determining block 805 is "no".

The repairing block 809 may include a first column determining block 811, a first redundancy connecting block 813, and a redundancy connecting block 815. In the first column determining block 81 1, it is determined whether the data transfer line IOk is the first normal column starting from the redundancy column, when the result of the determining block 805 is "no". In the first redundancy connecting block 813, the data transfer line IOk is connected to the redundancy data input and output lines RIO when the result of the first column determining block 811 is "yes". In the redundancy connecting block 815, the data transfer line IOk is connected to a normal data input and output line NIOk−1.

When the faulty cells are repaired as described above, the originally assigned normal data input and output lines are connected to the data transfer lines like in the normal state, in the columns having numbers higher than that of the column having the faulty cells. The data transfer lines corresponding to the columns having numbers equal to and less than that of the column having the faulty cells are connected to the normal data input and output lines or the redundancy data input and output lines corresponding to the columns preceding by one column. Therefore, the difference of lengths of the data paths of the respective columns during the redundancy operation are reduced.

Figure 9:
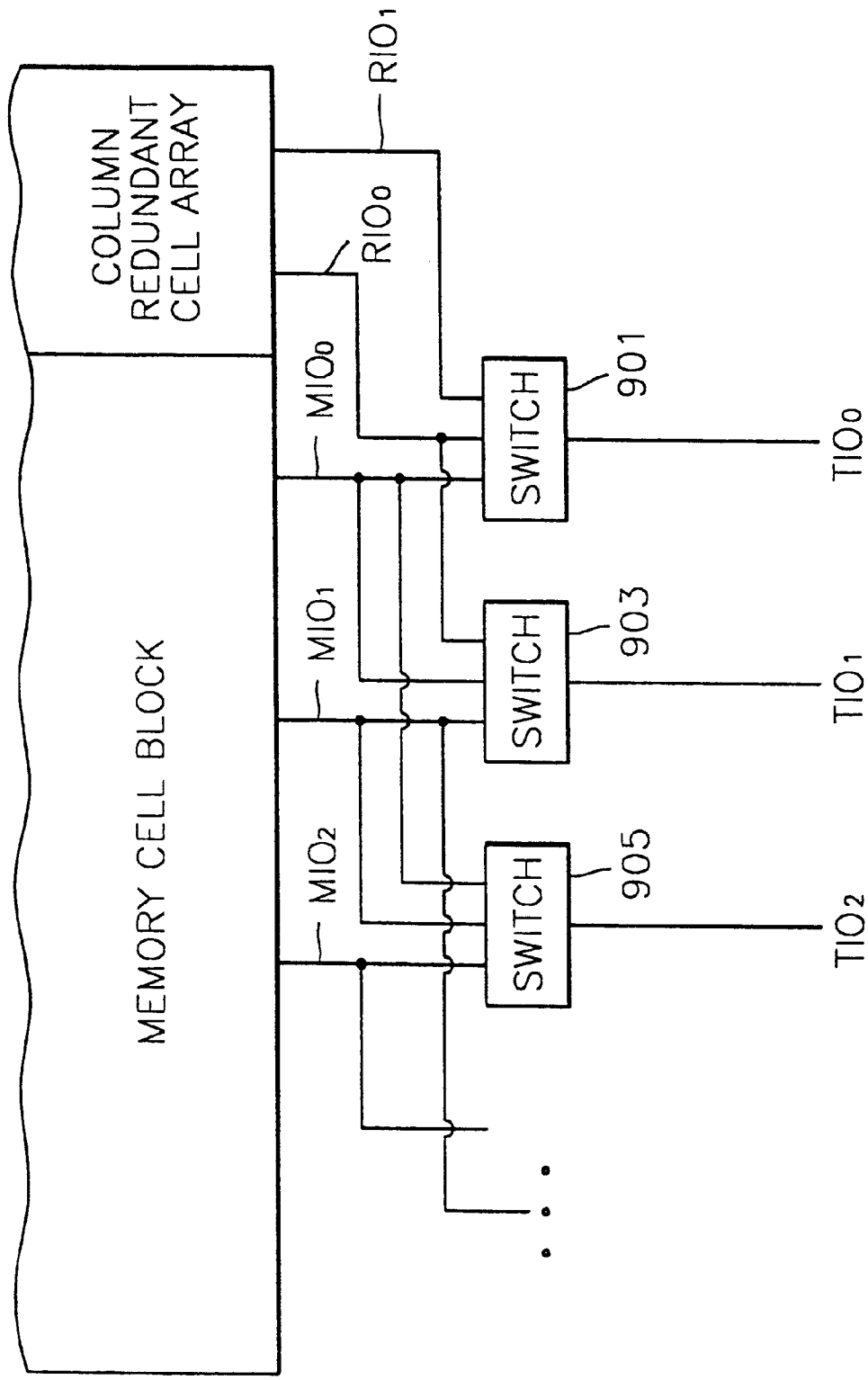
FIG. 9 is a block diagram showing a second embodiment of a faulty cell repairing circuit applied for a memory device of FIG. 3.

FIG. 9 is a block diagram showing a second embodiment of a faulty cell repairing circuit applied to a memory device of FIG. 3. Referring to FIG. 9, the present embodiment relates to faulty cell repairing circuits for memory devices having a normal memory cell block including first, second, and third normal columns and a redundancy memory cell block having first and second redundancy columns. A faulty cell repairing circuit of the memory device according to the present embodiment includes first, second, and third normal data input and output lines MIO0, MIO1, and MIO2, first and second redundancy data input and output lines RIO0 and RIO1, first, second, and third data transfer lines TIO0, TIO1, and TIO2, and first, second, and third switches 901, 903, and 905.

The first, second, and third normal data input and output lines MIO0, MIO1, and MIO2 input and output data, corresponding to the first, second, and third normal columns. The first and second redundancy data input and output lines RIO0 and RIO1 input and output data corresponding to the first and second redundancy columns. The first, second, and third data transfer lines TIO0, TIO1, and TIO2 input data to the external circuit and output data from the external circuit.

The first switch 901 connects the first data transfer line TIO0 to the first normal data input and output line MIO1 during normal operation. The first switch 901 connects the first data transfer line TIO0 to the first redundancy data input and output line RIO0 during a one column moving redundancy operation. The one column moving redundancy operation means that, when a specific column is selected and there are faulty cells in one column among the columns after the specific column, the specific data transfer line is connected to the data input and output line prior by one column.

The first switch 901 connects the first data transfer line TIO0 to the second redundancy data input and output line R1O1 during a two column moving redundancy operation. The two column moving redundancy operation means that, when a specific column is selected and there are faulty cells in two columns among the columns after the specific column, the specific data transfer line is connected to the data input and output line prior by two columns.

The second switch 903 connects the second data transfer line T1i0 to the second normal data input and output line M101 during the normal operation. The second switch 903 connects the second data transfer line TIO1 to the first normal data input and output line MIO0 during the one column moving redundancy operation. The second switch 903 connects the second data transfer line TIO1 to the first redundancy data input and output line RIO0 during the two column moving redundancy operation. The third switch 905 connects the third data transfer line TIO2 to the third normal data input and output line MIO2 during the normal operation. The third switch 905 connects the third data transfer line TIO2 to the second normal data input and output line MIO1 during the two column moving redundancy operation.

It will be understood that reference was made with respect to three normal columns. However, such a structure can be applied to memory devices having more than three columns. When there are no faulty cells in the memory cell block, the data transfer lines are connected to the original assigned normal data input and output lines. However, when faulty cells are generated in two columns after the related column, the normal data input and output lines corresponding to two preceding columns are connected to the data transfer lines.

When faulty cells are generated in one column after the related column, the normal data input and output lines corresponding to the column preceding by one are connected to the data transfer lines. When no faulty cells are generated in the columns after the related column, the original normal data input and output lines are connected to the data transfer lines.

For example, when faulty cells exist in the fifth and seventh columns, counting from the right, of FIG. 6, i.e., the columns corresponding to MIO4 and MIO6 (not shown) on the basis of the column redundant cell array, TIO0 and TIO1 are connected to RIO1 and RIO0. TIO2, TIO3, and TIO4 (not shown) are connected to MIO0, MIO1, and MIO2, respectively. TIO5 and TIO6 (not shown) corresponding to the sixth and seventh columns are respectively connected to MIO4 and MIO5 (not shown). From the eighth column, TIOi is connected to MIOi like in the normal operation.

Figure 10:
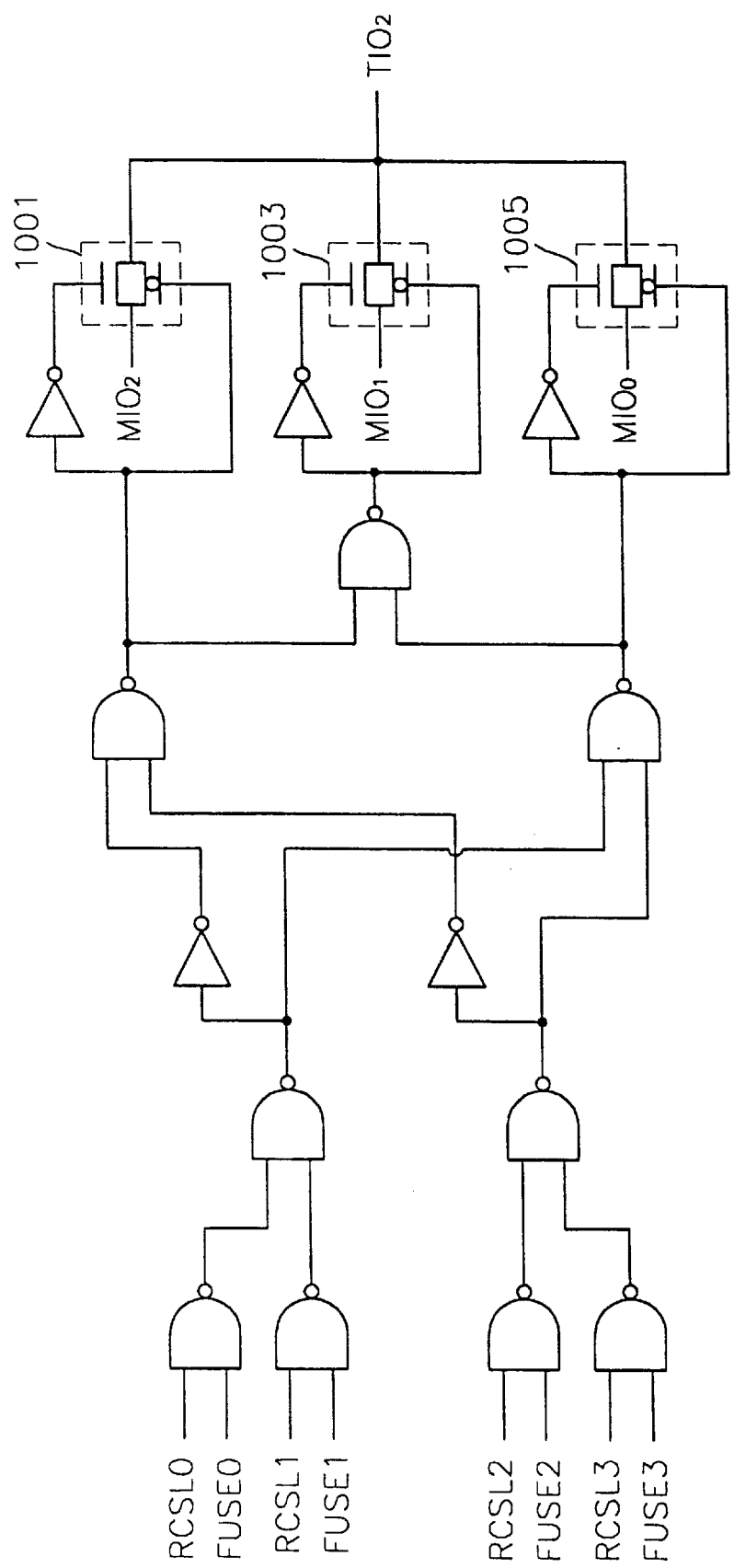
FIG. 10 shows an embodiment of a switch 905 of the faulty cell repairing circuit of FIG. 9.

FIG. 10 shows an embodiment of a faulty cell repairing circuit switch 905 of FIG. 9. Referring to FIG. 10, a switch of the present embodiment includes a first transfer gate 1001, a second transfer gate 1003, and a third transfer gate 1005. The first transfer gate 1001 is turned on in the normal operation state for connecting the normal data input and output line MIO2 to the data transfer line TIO2. The second transfer gate 1003 is turned on for connecting the normal data input and output line MIO1 to the data transfer line TIO2 in the one column moving redundancy operation. The third transfer gate 1005 is turned on in the case of the two column moving redundancy operation, for connecting the normal data input and output line MIO1 to the data transfer line TIO2.

In the present invention, the control of the first, second, and third transfer gates 1001, 1003 and 1005 is determined by the redundancy control signal RCSLi and FUSEi is generated by a fuse. Namely, when a pair of RCSLi and FUSEi become "high", the second transfer gate 1003 is turned on and the normal data input and output line MIO1 is connected to the data transfer line TIO2. When a pair RCSL0 and FUSE0 or a pair RCSL1 and FUSE1 go to high at the same time, and a pair RCSL2 and FUSE2 or a pair RCSL3 and FUSE3 go to high at the same time, the third transfer gate 1005 is turned on for connecting the normal data input and output line MIO1 to the data transfer line TIO2.

It will be understood that reference was made above with respect to the switch 905 corresponding to the data transfer line TIO2, but the above also applies to the switches 901 and 903. However, in the switch 901, TIO0 is connected to the redundancy data input and output line RIO1 during the two column moving redundancy operation, and connected to the redundancy data input and output line RIO0 during the one column moving redundancy operation. In the switch 903, TIO1 is connected to the redundancy data input and output line RIO0 during the two column moving redundancy operation.

Figure 11:
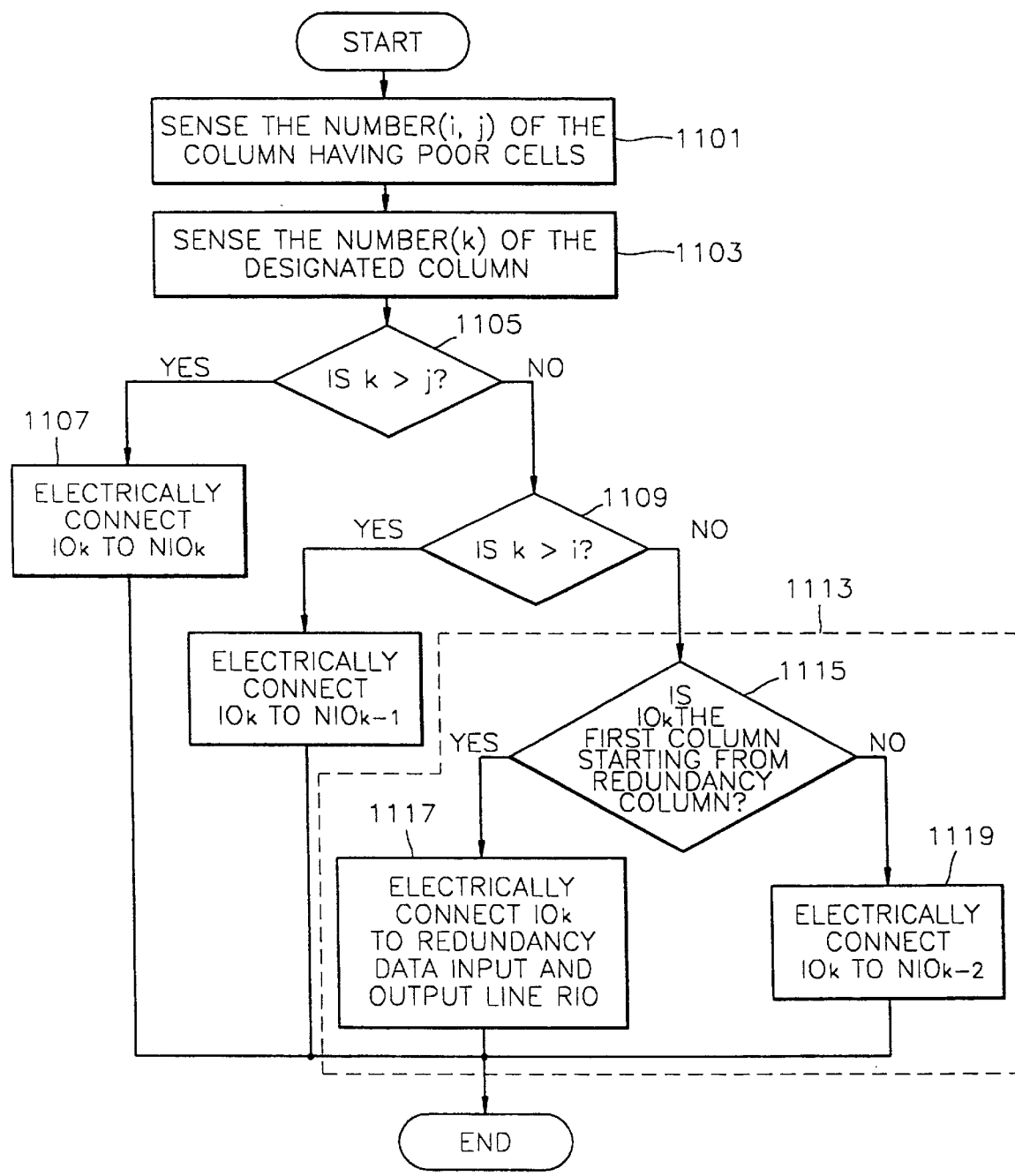
FIG. 11 is a flowchart showing methods and systems of repairing faulty cells that can use the faulty cell repairing circuit of FIG. 9.

FIG. 11 is a flowchart showing methods and systems including respective steps and means for repairing faulty cells that can use a faulty cell repairing circuit of FIG. 9. Referring to FIG. 11, the present invention relates to repairing faulty cells of a memory device having a plurality of normal columns and at least two redundancy columns. Faulty cell repairing according to the present invention includes a failed column detecting block 1101, a designated column detecting block 1103, a first determining block 1105, a normal connecting block 1107, a second determining block 1109, a one column moving repair block 1111, and a two column moving repair block 1113.

In the failed column detecting block 1101, the numbers i and j (i<j) of two columns having faulty cells are sensed by counting by position with reference to the redundancy columns. In the designated column detecting block 1103, the number k of the column which will perform the READ or WRITE operation of the data is sensed by position with reference to the redundancy column. In the first determining block 1105, it is determined whether k is larger than j. In the normal connecting block 1107, the data transfer line IOk is connected to the normal data input and output line NIOk when the result of the first determining block 1105 is "yes". In the second determining block 1109, it is determined whether k is larger than I when the result of the first determining block 1105 is "no".

In the one column moving repair block 1111, the data transfer line IOk is connected to the normal data input and output line NIOk−1 when the result of the second determining block 1109 is "yes". In the two column moving repair block 1113, the data transfer line IOk is connected to the data input and output line of two columns previous, when the result of the second determining block 1109 is "no".

The second column moving repair block 1113 includes a first column determining block 1115, a first redundancy connecting block 1117, and a redundancy connecting block 1119. In the first column determining block 1115, it is determined whether the data IOk is the first normal column starting from the redundancy column, when the result of the second determining block 1109 is "no". In the first redundancy connecting block 1117, the data transfer line IOk is connected to the redundancy data input and output line RIO when the result of the first column determining block 1115 is "yes". In the redundancy connecting block 1119, the data transfer line IOk is connected to the normal data input and output line NIOk−1 when the result of the first column determining block 1115 is "no".

When the faulty cells are repaired as described above, in the columns having higher numbers than the column having the faulty cells, the originally assigned normal data input and output lines are connected to the data transfer lines like in the normal state. When a column having faulty cells is included among the columns having numbers higher than that of a specific column, the data transfer lines are connected to the normal data input and output lines corresponding to the column preceding by one column. When two columns having faulty cells are included in the columns having higher numbers than the specific column, the data transfer lines are connected to the input and output lines corresponding to the column preceding by two columns. Accordingly, it is possible to reduce the difference in length of the data paths of the respective columns during the redundancy operation.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. An integrated circuit memory device comprising:
   a normal memory cell block including first and second normal columns;
   a redundancy memory cell block including a redundancy column;
   first and second normal data input and output lines that input data to and output data from the first and second normal columns, respectively;

redundancy data input and output lines that input data to and output data from the redundancy column;

first and second data transfer lines that input data to and output data from a memory cell;

a first switch that connects the first data transfer line to the first normal data input and output line during a normal operation and that connects the first data transfer line to the redundancy data input and output lines during a redundancy operation; and a second switch that connects the second data transfer line to the second normal data input and output line during a normal operation and that connects the second data transfer line to the first normal data input and output line during the redundancy operation.

2. A method of operating an integrated circuit memory having a plurality of columns of memory cells arranged in sequence from a first order column to an Nth order column and having first through Nth order switches wherein each switch is connected to an equal order column and a lower order column via respective first and second data input and output lines, and having first through N data transfer lines connected to the first through Nth order switches respectively, the method comprising:

determining that an ith order column includes a faulty memory cell, wherein is between 1 and N;

determining that a kth order data transfer line is used to access a kth order column where k is between 1 and N; and connecting the kth order data transfer line to a column having an order that is less than k if k is not greater than i.

3. A method according to claim 2 further comprising:

connecting the kth order data transfer line to the kth order column if k is greater than i.

4. A method according to claim 2 further comprising:

connecting a kth−1 order data transfer line to a column having an order that is less than k−1 if k is not greater than i.

5. An integrated circuit memory having a plurality of columns of memory arranged in sequence from a first order column to an Nth order column and having first through Nth order switches wherein each switch is connected to an equal order column and a lower order column via respective first and second data input and output lines and having first through N data transfer lines connected to the first through N order switches respectively, the integrated circuit memory comprising:

means for determining that an ith order column includes a faulty memory cell, wherein i is between 1 and N;

means for determining that a kth order data transfer line is used to access a kth order column where k is between 1 and N; and means for connecting the kth order data transfer line to a column having an order that is less than k if k is not greater than i.

6. An integrated circuit according to claim 5 further comprising:

means for connecting the kth order data transfer line to the kth order column if k is greater than i.

7. An integrated circuit according to claim 5 further comprising:

means for connecting a kth−1 order data transfer line to a column having an order that is less than k−1 if k is not greater than i.

8. An integrated circuit memory having a plurality of columns of memory arranged in sequence from a first order column to an Nth order column and having first through Nth order switches wherein each switch is connected to an equal order column and a lower order column via respective first and second data input and output lines and having, first through N data transfer lines connected to the first through N order switches respectively, the integrated circuit memory comprising:

a first circuit configured to determine that an ith order column includes a faulty memory cell, wherein i is between 1 and N;

a second circuit configured to determine that a kth order data transfer line is used to access a kth order column where k is between 1 and N; and a third circuit configured to connect the kth order data transfer line to a column having an order that is less than k if k is not greater than i.

9. An integrated circuit according to claim 8 further comprising:

a fourth circuit configured to connect the kth order data transfer line to the kth order column if k is greater than i.

10. An integrated circuit according to claim 8 further comprising:

a fifth circuit configured to connect a kth−1 order data transfer line to a column having an order that is less than k−1 if k is not greater than i.

* * * * *